United States Patent
Teng et al.

(10) Patent No.: US 9,929,304 B2
(45) Date of Patent: Mar. 27, 2018

(54) METHOD AND SYSTEM FOR FORMING ABSORBER LAYER ON METAL COATED GLASS FOR PHOTOVOLTAIC DEVICES

(71) Applicant: TSMC Solar Ltd., Taichung (TW)

(72) Inventors: Edward Teng, Sunnyvale, CA (US); Ying-Chen Chao, Hsinchu (TW); Chih-Jen Yang, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 331 days.

(21) Appl. No.: 14/685,667

(22) Filed: Apr. 14, 2015

(65) Prior Publication Data
US 2015/0221811 A1    Aug. 6, 2015

Related U.S. Application Data

(62) Division of application No. 13/733,989, filed on Jan. 4, 2013, now Pat. No. 9,029,737.

(51) Int. Cl.
*F27B 5/14* (2006.01)
*F27B 5/06* (2006.01)
(Continued)

(52) U.S. Cl.
CPC .......... *H01L 31/1864* (2013.01); *C23C 14/18* (2013.01); *C23C 14/34* (2013.01);
(Continued)

(58) Field of Classification Search
None
See application file for complete search history.

(56) References Cited

U.S. PATENT DOCUMENTS 2,768,098 A * 10/1956 Hoppe .................... C23C 14/22
                                                                118/730
2,885,997 A *  5/1959 Schwindt .............. C23C 14/505
                                                                118/730
(Continued)

FOREIGN PATENT DOCUMENTS

CN    102534491 A    7/2012
JP    03-082762 A    4/1991
(Continued)

OTHER PUBLICATIONS

CN 102534491 A, "Preparation Device and Method for . . . Thin Film Solar Cell," Guo et al, Jul. 2012, partial translation.*
(Continued)

*Primary Examiner* — Joseph M Pelham
(74) *Attorney, Agent, or Firm* — Duane Morris LLP

(57) ABSTRACT

An apparatus for forming a solar cell includes a housing defining a vacuum chamber, a rotatable substrate support, at least one inner heater and at least one outer heater. The substrate support is inside the vacuum chamber configured to hold a substrate. The at least one inner heater is between a center of the vacuum chamber and the substrate support, and is configured to heat a back surface of a substrate on the substrate support. The at least one outer heater is between an outer surface of the vacuum chamber and the substrate support, and is configured to heat a front surface of a substrate on the substrate support.

18 Claims, 10 Drawing Sheets

(51) Int. Cl.
| | |
|---|---|
| *F27D 3/12* | (2006.01) |
| *F27D 11/02* | (2006.01) |
| *H01L 31/18* | (2006.01) |
| *C23C 14/22* | (2006.01) |
| *F27D 5/00* | (2006.01) |
| *H01L 31/032* | (2006.01) |
| *H01L 21/67* | (2006.01) |
| *H01L 21/687* | (2006.01) |
| *C23C 14/18* | (2006.01) |
| *C23C 14/34* | (2006.01) |
| *C23C 14/58* | (2006.01) |
| *F27D 3/00* | (2006.01) |

(52) U.S. Cl.
CPC ............ *C23C 14/5806* (2013.01); *F27B 5/14* (2013.01); *F27D 5/0037* (2013.01); *H01L 21/67109* (2013.01); *H01L 21/68764* (2013.01); *H01L 21/68771* (2013.01); *H01L 31/0322* (2013.01); *H01L 31/18* (2013.01); *F27D 2003/0087* (2013.01); *Y02E 10/541* (2013.01)

(56) References Cited

U.S. PATENT DOCUMENTS

| | | | | |
|---|---|---|---|---|
| 3,460,510 | A * | 8/1969 | Currin | C23C 16/00 118/720 |
| 3,645,230 | A * | 2/1972 | Hugle | H01L 21/68771 118/730 |
| 3,699,298 | A * | 10/1972 | Briody | H01C 17/20 118/725 |
| 3,719,166 | A * | 3/1973 | Gereth | C30B 25/14 118/725 |
| 3,805,360 | A | 4/1974 | Briody | |
| 3,806,360 | A * | 4/1974 | Briody | C23C 16/4588 117/101 |
| 3,865,072 | A * | 2/1975 | Kirkman | C30B 25/08 118/663 |
| 4,597,986 | A * | 7/1986 | Scapple | C23C 16/45578 118/50.1 |
| 4,615,294 | A * | 10/1986 | Scapple | C23C 16/45578 118/50.1 |
| 4,675,096 | A * | 6/1987 | Tateishi | C23C 14/566 204/192.12 |
| 4,716,048 | A * | 12/1987 | Ishihara | H01L 21/0237 136/258 |
| 4,772,356 | A * | 9/1988 | Schumaker | C23C 16/455 117/101 |
| 4,838,983 | A * | 6/1989 | Schumaker | C23C 16/455 117/101 |
| 5,053,247 | A * | 10/1991 | Moore | C23C 16/44 118/724 |
| 5,154,810 | A * | 10/1992 | Kamerling | C23C 14/08 118/712 |
| 5,439,575 | A | 8/1995 | Thornton et al. | |
| 5,618,388 | A * | 4/1997 | Seeser | C23C 8/02 118/719 |
| 5,855,970 | A * | 1/1999 | Inushima | C23C 16/0245 257/E21.278 |
| 6,013,338 | A * | 1/2000 | Inushima | C23C 16/0245 257/E21.279 |
| 6,096,998 | A * | 8/2000 | Robinson | F27B 17/00 118/50.1 |
| 6,155,201 | A * | 12/2000 | Murayama | C23C 16/4588 118/723 E |
| 6,157,003 | A * | 12/2000 | Drimer | C30B 25/105 118/725 |
| 6,288,367 | B1 | 9/2001 | Robinson et al. | |
| 6,310,281 | B1 | 10/2001 | Wendt et al. | |
| 6,350,497 | B1 | 2/2002 | Murayama et al. | |
| 6,485,616 | B1 * | 11/2002 | Howard | C23C 14/505 118/728 |
| 6,520,189 | B1 * | 2/2003 | Inushima | C23C 16/0245 134/1.1 |
| 6,696,108 | B2 * | 2/2004 | Murayama | G03G 5/08278 118/723 E |
| 6,747,249 | B2 | 6/2004 | Robinson et al. | |
| 6,974,976 | B2 | 12/2005 | Hollars | |
| 8,785,235 | B2 | 7/2014 | Teng et al. | |
| 2011/0030794 | A1* | 2/2011 | Teng | C23C 14/0623 136/262 |
| 2013/0210190 | A1* | 8/2013 | Teng | H01L 31/0322 438/95 |
| 2014/0131193 | A1* | 5/2014 | Teng | C23C 14/044 204/192.1 |
| 2014/0131198 | A1* | 5/2014 | Teng | H01L 31/18 204/298.07 |
| 2015/0021163 | A1* | 1/2015 | Lu | H01L 21/67115 204/192.1 |

FOREIGN PATENT DOCUMENTS

| | | |
|---|---|---|
| JP | 03274267 A | 12/1991 |
| JP | 05148633 A | 6/1993 |

OTHER PUBLICATIONS

Nakada, T. et al., "Sequential Sputtering/Selenization Techniques for the Growth of CuInSe2 Thin Films", Jpn. J. Appl. Phys., 1998, 37:L1065-L1067.

Nakada, T. et al., "Growth of CuInSe2 Films for Solar Cells by Using a Multi-Source Sputtering Apparatus", Technical Digest of the International PVSEC-3, Tokyo, Japan, 1987, P-11-10, pp. 553-556.

Nakada, T. et al., "Microstructural Characterization for Sputter-Deposited CuInSe2, Films and Photovoltaic Devices", Jpn. J. Appl. Phys., 1995, 34:4715-4721.

* cited by examiner

US 9,929,304 B2

METHOD AND SYSTEM FOR FORMING ABSORBER LAYER ON METAL COATED GLASS FOR PHOTOVOLTAIC DEVICES

PRIORITY CLAIM AND CROSS-REFERENCE

This application is a divisional application of U.S. patent application Ser. No. 13/733,989, filed Jan. 4, 2013, which application is expressly incorporated by reference herein in its entirety.

FIELD

The disclosure relates to photovoltaic devices generally, and more particularly relates to a system and method for producing photovoltaic devices.

BACKGROUND

Photovoltaic devices (also referred to as solar cells) absorb sun light and convert light energy into electricity. Photovoltaic devices and manufacturing methods therefor are continually evolving to provide higher conversion efficiency with thinner designs.

Thin film solar cells are based on one or more layers of thin films of photovoltaic materials deposited on a substrate such as glass. The film thickness of the photovoltaic materials ranges from several nanometers to tens of micrometers. Such photovoltaic materials function as light absorbers. A photovoltaic device can further comprise other thin films such as a buffer layer, a back contact layer, and a front contact layer.

Copper indium gallium diselenide (CIGS) is a commonly used absorber layer in thin film solar cells. CIGS thin film solar cells have achieved excellent conversion efficiency (>20%) in laboratory environments. Most conventional CIGS deposition is done by one of two techniques: co-evaporation or selenization. Co-evaporation involves simultaneously evaporating copper, indium, gallium and selenium. The different melting points of the four elements makes controlling the formation of a stoichiometric compound on a large substrate very difficult. Additionally, film adhesion is very poor when using co-evaporation. Selenization involves a two-step process. First, a copper, gallium, and indium precursor is sputtered on to a substrate. Second, selenization occurs by a reaction of the precursor with $H_2Se/H_2S$ at 500° C. or above.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like reference numerals denote like features throughout specification and drawing.

DETAILED DESCRIPTION

Figure 1:
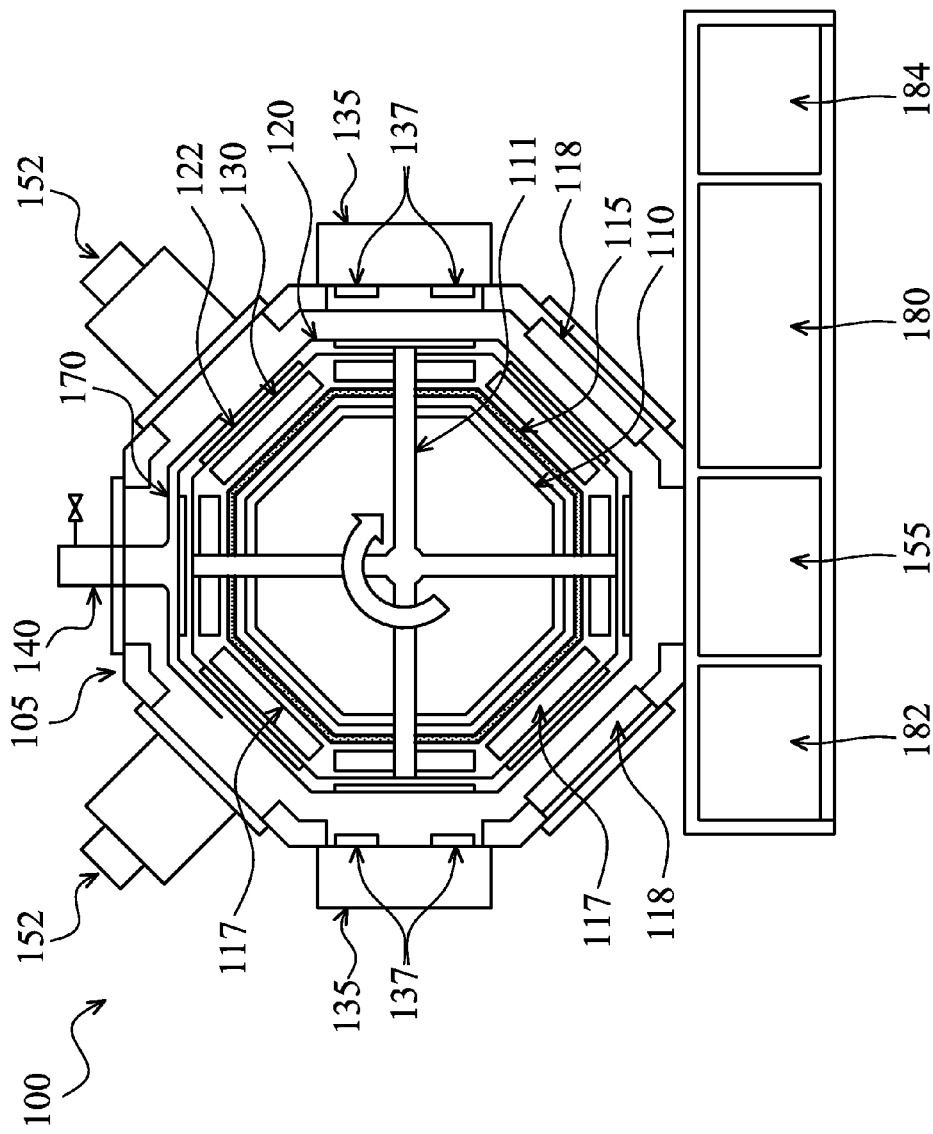
FIG. 1 is a plan view of an apparatus for forming a solar cell, which comprises at least one inner heater and at least one outer heater, in accordance with some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Glass such as soda lime glass can be used as a substrate in thin film solar cells. In general, a back contact layer, a light absorber layer of photovoltaic material, a buffer layer, and a front contact layer can be deposited over the substrate, respectively. Examples of suitable materials for the back contact layer deposited over the glass include, but are not limited to copper, nickel, molybdenum (Mo) or any other metal or conductive material. Example of suitable materials for the light absorber layer include but are not limited to cadmium telluride (CdTe), copper indium gallium selenide (CIGS) and amorphous silicon (α-Si). Depending on the type of the photovoltaic material for the absorb layer, the buffer layer can be either an n-type or a p-type semiconductor materials including but are not limited to CdS and ZnS. The front contact layer is a transparent conductive material such as indium tin oxide (ITO).

The inventors have determined that non-uniformity of temperature can cause a substrate—particularly a metal coated glass substrate—to deform and even crack when a subsequent layer is deposited over the substrate under heating conditions. The factors causing such a temperature variation include but are not limited to material difference between the substrate and the back contact layer; and material difference between the substrate and substrate holder contacting the substrate. The inventors have determined that a metal layer coated on glass as the back contact layer can reflect heat while glass absorbs heat inside the vacuum chamber, and can cause uneven temperature distribution cross the substrate. The substrate holder and other structural materials inside the vacuum chamber are generally metals. Different coefficient of thermal expansion (CTE) can worsen the problem to cause deformation, warping, cracking or other damage to the substrate.

In some embodiments, this disclosure provides an apparatus and a method for forming a solar cell, in which a substrate such as glass is heated without cracking or deformation, and an absorbed layer can be formed over the substrate. For example, in accordance with some embodiments in this disclosure, a good absorber layer can be deposited over a metal coated glass substrate when the substrate is heated under a temperature close to its glass transition temperature. The apparatus and the method are suitable for forming a solar cell or other photovoltaic devices using a substrate such as glass of different sizes including large glass panel.

Unless expressly indicated otherwise, references to a "front side" of a substrate made in this disclosure will be understood to encompass the side on which a light absorber layer will be deposited. References to a "back side" of the substrate made below will be understood to encompass the other side opposite to the side where the light absorber layer will be deposited. References to a "substrate" will be understood to encompass a substrate with or without a back contact layer, for example, a metal coated glass substrate. When the substrate is a metal coated glass, the "back side" is the glass layer while the "front side" is the metal layer deposited over the glass layer as the back contact layer.

FIG. 1 is a plan view of an apparatus 100 for forming a solar cell. In accordance with some embodiments, apparatus 100 comprises a housing defining a vacuum chamber 105, a rotatable substrate support 120, at least one inner heater 117 and at least outer heater 118.

As shown, apparatus 100 includes a housing 105 defining a vacuum chamber. In some embodiments, housing 105 may be shaped as a polygon. For example, as shown in FIG. 1, housing 105 may be octagonally shaped. In some embodiments, housing 105 has one or more removable doors built on one or more sides of the vacuum chamber. Housing defining a vacuum chamber 105 may be composed of stainless steel or other metals and alloys. For example, housing 105 can define a single vacuum chamber having a height of approximately 2.4 m (2.3 m to 2.5 m) with a length and width of approximately 9.8 m (9.7 m to 9.9 m). References to a "vacuum chamber" 105 or a "housing" 105 defining a vacuum chamber in this disclosure will be understood to encompass the same meaning.

Apparatus 100 includes a rotatable substrate support 120. In some embodiments, substrate support 120 is configured to hold a substrate 130 on each of a plurality of surfaces 122 facing an interior surface of the vacuum chamber. In some embodiments, examples of suitable materials for substrate 130 include but are not limited to glass and metal coated glass. In some embodiments, rotatable substrate support 120 is shaped as a polygon. For example, as shown in FIG. 1, a plurality of substrates 130 are held on a plurality of surfaces 122 in a substantially octagonal shaped rotatable substrate support 120. Any other suitable shape, such as rectangle or square, can be used for rotatable substrate support 120.

Rotatable substrate support 120 comprises a plurality of metal posts 121, and a plurality of metal frames 124 connected to the plurality of metal posts 121 in some embodiments. Each of the plurality of metal frames 124 may also comprise at least one fixture 123 in the edge. Metal posts 121 and metal frames 124 are configured to hold a respective substrate 130.

Figure 3A:
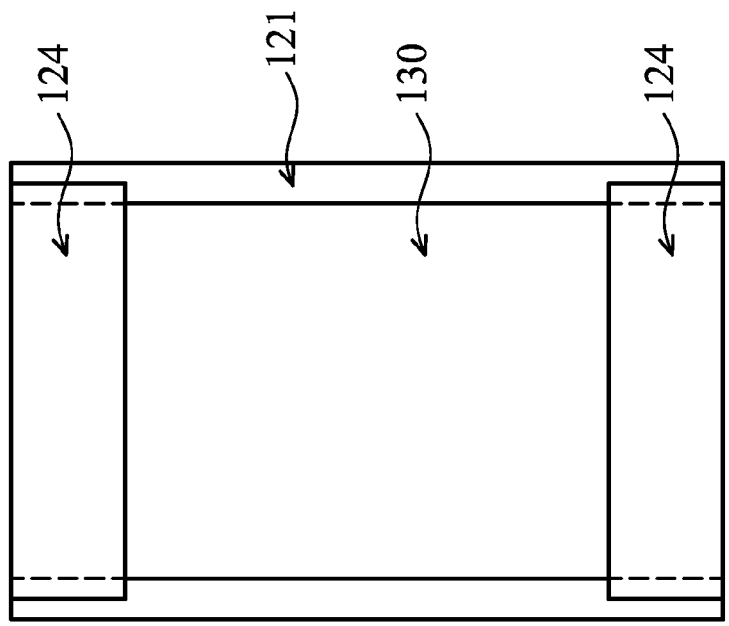
FIGS. 3A and 3B illustrate examples of a portion of the substrate support comprising a plurality of metal posts and a plurality of metal frames, which is configured to hold a respective substrate, in accordance with some embodiments.
Figure 3B:
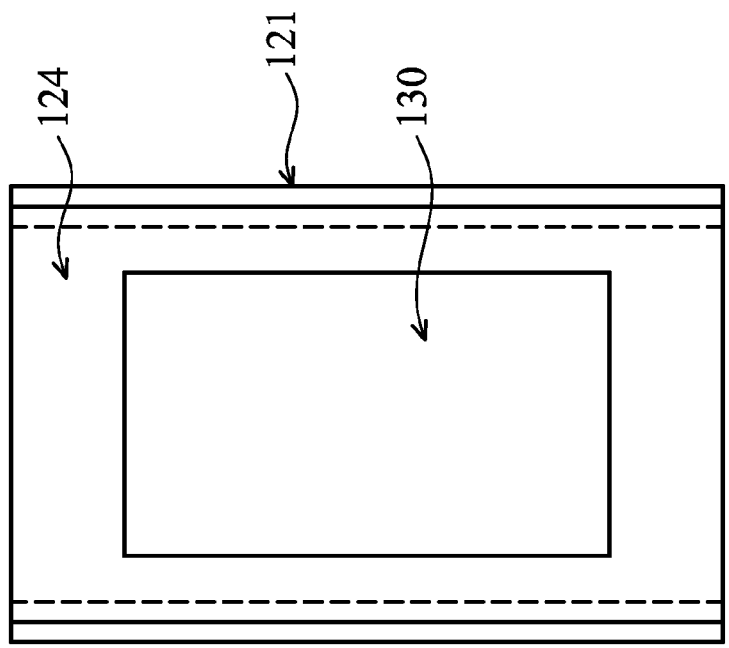

FIGS. 3A and 3B illustrate examples of a portion of the substrate support 120 comprising a plurality of metal posts 121 and a plurality of metal frames 124, which is configured to hold a respective substrate 130, in accordance with some embodiments. Substrate 130 can be in any shape. In some embodiments, metal frames 124 are configured to hold substrate 130 in rectangular shape. As shown in FIG. 3A, metal frame 124 can be in one piece holding one respective substrate 130 in the middle. As shown in FIG. 3B, substrate can be held with multiple pieces of metal frames 124. Examples of suitable materials for metal frames 124 and metal posts 121 can be any metal. In some embodiments, metal frames 124 and metal posts 121 are made of a material selected from the group consisting of stainless steel, titanium and molybdenum.

Figure 4A:
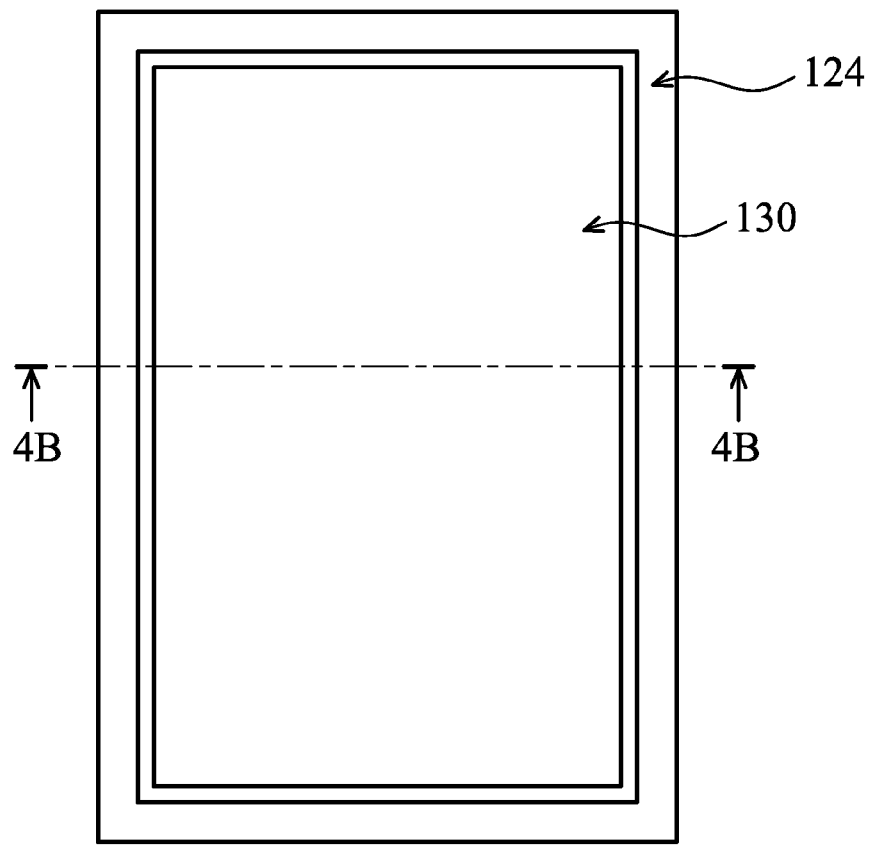
FIGS. 4A and 4B illustrate a plan view and a cross-sectional view of a substrate held by metal frames along its entire length in accordance with some embodiments.
Figure 4B:
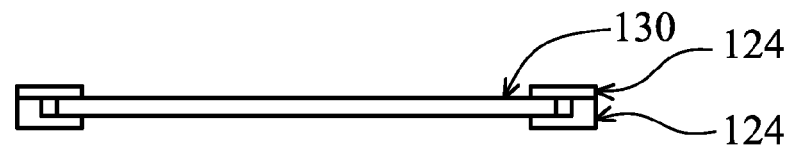

Metal posts 121 and metal frames 124 can be configured in different combinations to hold substrate 130. In some embodiments, each of the plurality of metal frames 124 is configured to support a respective substrate 130 along its entire length, and each substrate edge is held along its entire length through the at least one fixture on the plurality of metal frames 124. FIGS. 4A and 4B illustrate a plan view and a cross-sectional view of a substrate held by metal frame 124 along its entire length.

Figure 5A:
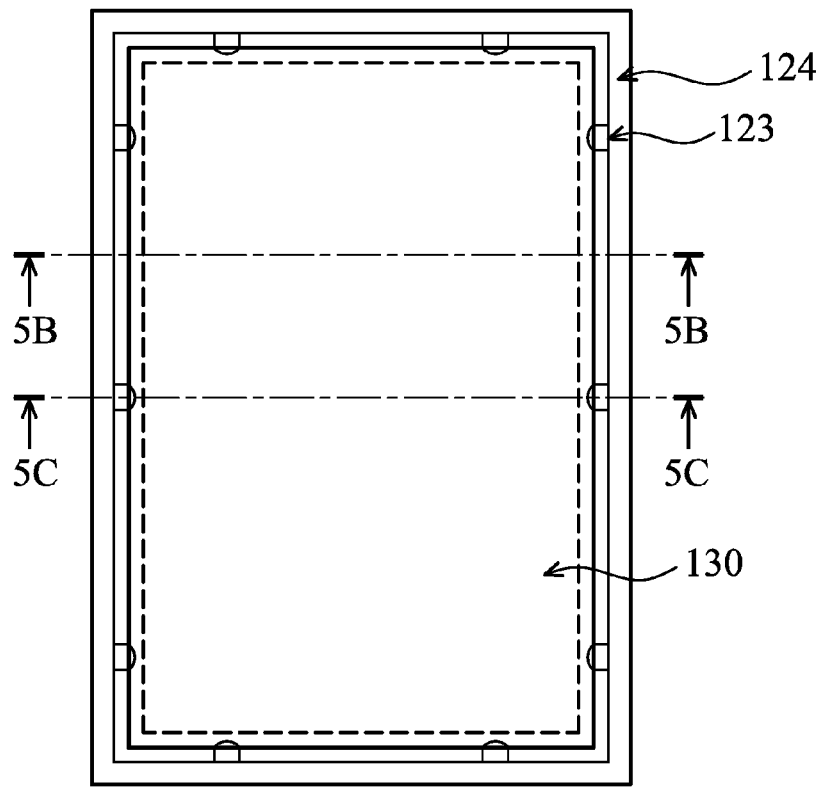
FIGS. 5A-5C illustrate a plan view and two cross-sectional view of an example of a substrate attached with metal frames contacting along a portion of its length through at least one fixture on the same side of the metal frames, in accordance with some embodiments.
Figure 5B:
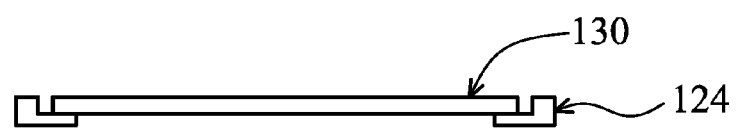
Figure 5C:
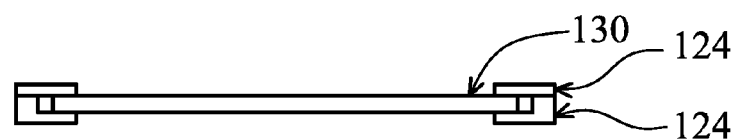
Figure 6A:
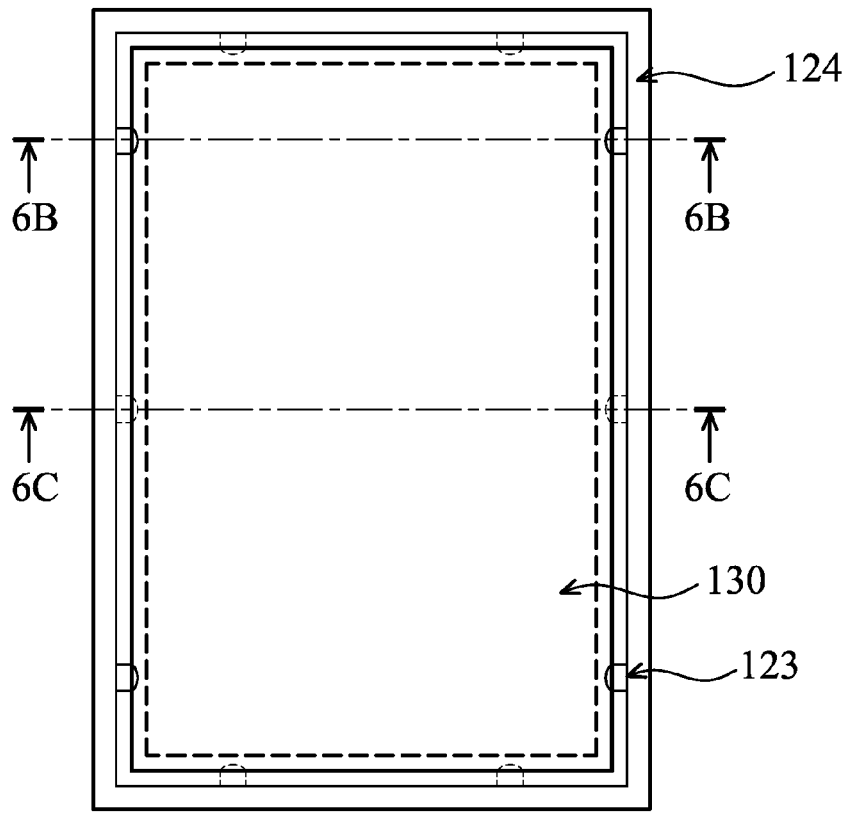
FIGS. 6A-6C illustrate a plan view and two cross-sectional view of an example of a substrate attached with metal frames contacting along a portion of its length through at least one fixture on both sides of the metal frames, in accordance with some embodiments.
Figure 6B:
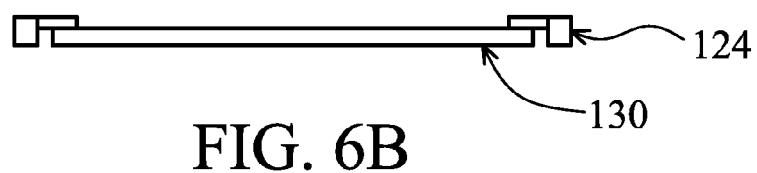
Figure 6C:
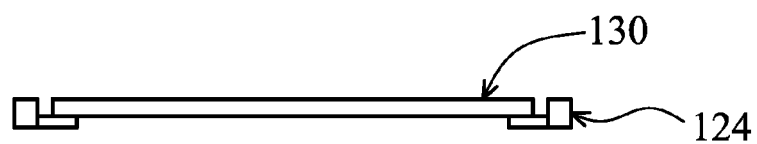

In other embodiments, each respective substrate 130 is attached with a respective one of metal frames 124 contacting along a portion of its length, and each substrate edge is retained by a respective fixture 123 at selected points on the respective metal frame 124. FIGS. 5A-5C illustrate a plan view and two cross-sectional views of an example of substrate 130 attached with metal frames 124 contacting along a portion of its length through at least one fixture on the same side of metal frames 124. FIGS. 5B and 5C illustrate a cross section along the section line 5B-5B and 5C-5C shown in FIG. 5A, respectively. In this example, all the fixtures 123, are on one side of metal frame 124. FIGS. 6A-6C illustrate a plan view and two cross-sectional views of another example of a substrate 130 attached with metal frames 124 contacting along a portion of its length through at least one fixture on both sides of the metal frames. FIGS. 6B and 6C illustrate a cross section along the section line 6B-6B and 6C-6C shown in FIG. 6A, respectively. In this example, some of fixtures 123 are on one side of metal frame 124, while some other fixtures 123 are on the other side of metal frame 124. One piece of metal frame 124 is shown in FIGS. 4A-4B, 5A-5C, and 6A-6C for purpose of illustration. Rotatable substrate support 120 may comprise a plurality of metal frames 124.

Referring back to FIG. 1, in some embodiments, substrate support 120 is rotatable about an axis in the vacuum chamber. FIG. 1 illustrates a clockwise direction of rotation for rotatable substrate support 120. In some embodiments, substrate support 120 is configured to rotate in a counter-clockwise direction. In some embodiments, rotatable substrate support 120 is operatively coupled to a drive shaft, a motor or other mechanism that actuates rotation from a surface of the vacuum chamber. Substrate support 120 can be rotated at a speed, for example, between approximately 5 and 100 RPM (e.g., 3 and 105 RPM). In some embodiments, a speed of rotation is selected to minimize excessive deposition of absorption components over substrate 130. In some embodiments, substrate support 120 rotates at a speed of approximately 80 RPM (e.g. 75-85 RPM).

In some embodiments, apparatus 100 also comprises a rotatable drum 110, which is disposed within vacuum chamber 105 and coupled to a top or bottom surface of vacuum chamber 105. Rotatable drum 110 may also comprise supporting beams 111 connected with rotatable substrate support 120. Rotatable drum 110 can be operatively coupled to substrate support 120 through support beams 111, and is configured to rotate substrate support 120 inside vacuum chamber 105. In some embodiments, rotatable drum 110 has a shape that is substantially the same as the shape of substrate support 120. In other embodiments, rotatable drum 110 can have any suitable shape.

In some embodiments, apparatus 100 also comprises at least one inner heater 117 and at least one outer heater 118. In some embodiments, the at least one inner heater 117 is between a center of vacuum chamber 105 and substrate holder 120, and is configured to face a back surface of substrate 130 and heat a back surface of substrate 130 on substrate support 120. In some embodiments, the at least one inner substrate can the whole substrate 130 from the back surface. In some embodiments, the at last one inner heater 117 is configured to heat a plurality of substrates 130 held on rotatable substrate support 120 when substrate support 120 is rotated. The at least one inner heater 117 can have any suitable shape. In some embodiments, the rotatable substrate support 120 is polygonally-shaped, and the at least one inner heater 117 is configured to have a circular shape to avoid any collision between substrate support 120 and the at least inner heater 117. In other embodiments the at least one inner heater 117 has a shape that is substantially the same as the shape of substrate support 120. In some embodiments, the rotatable substrate support 120 is polygonally-shaped, and the at least one inner heater 117 has a shape substantially the same as the shape of substrate support 120. For example, as shown in FIG. 1, the at least one inner heater 117 has a substantially octagonal arrangement.

In some embodiments, the at least one inner heater 117 is disposed to maintain a substantially uniform distance about the perimeter of substrate support 120. In some embodiments, the at least one inner heater 117 is disposed between an interior surface of rotatable substrate support 120 and rotatable drum 110. A power source of the at least one inner heater 117 can extend through a surface of rotatable drum 110. In some embodiments, substrate support 120 is rotatable around the at least one inner heater 117. In some embodiments, the at least one inner heater 117 can be coupled to a top or bottom surface of vacuum chamber 105. The at least one inner heater 117 can be rotatable. In other embodiments, the at least one inner heater 117 is not rotatable. The at least one inner heater 117 can include, but is not limited to, infrared heaters, halogen bulb heaters, resistive heaters, or any suitable heater for heating a substrate 130 during a deposition process. In some embodiments, the at least one inner heater 117 can heat a substrate to a temperature between approximately 295° C. and 655° C. (e.g. 300° C. and 650° C.).

The at least one outer heater 118 is located between an outer surface (or shell) of vacuum chamber 105 (housing) and substrate support 120, and is configured to heat a front surface of substrate 130 on substrate support 120, in accordance with some embodiments. In some embodiments, the at least one outer heater 118 is attached on the interior surface of vacuum chamber 105. The at least one outer heater 118 can be configured to heat substrate 130 from a front surface of substrate 130 during rotation of substrate support 120.

The at least one outer heater 118 can include, but is not limited to, infrared heaters, halogen bulb heaters, resistive heaters, or any suitable heater for heating a substrate 130 during a deposition process. In some embodiments, the at least one outer heater 118 can heat a substrate 130 to a temperature between approximately 295° C. and 655° C. (e.g. 300° C. and 650° C.).

Figure 7B:
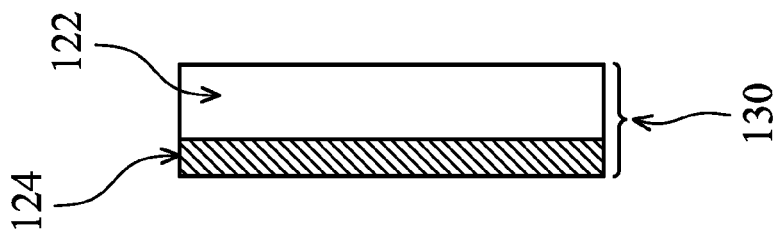
FIG. 7B is a magnified cross-section view of a portion of the substrate in FIG. 7A, showing a metal layer coated on a glass substrate, in accordance with some embodiments.
Figure 7A:
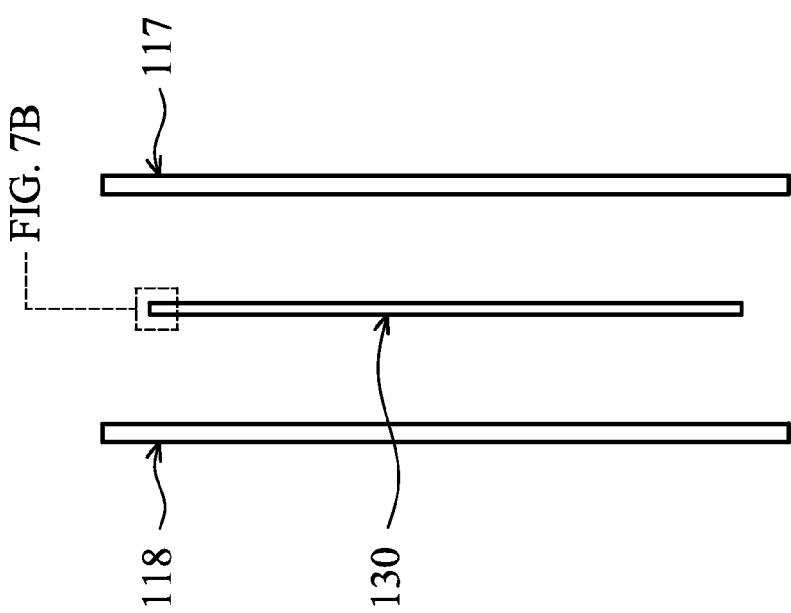
FIG. 7A is a top view illustrating an example of configuration with at least one inner heater and at least one outer heater which are configured to heat a substrate from both its back and front surface in some embodiments.

In some embodiments, the at least one outer heater 118 is configured to heat substrate 130 simultaneously while the substrate is heated by the at least one inner heater 117. The heat emitted from the at least one outer heater 118 mitigates non-uniformity of temperature within sample 130. For example, referring to FIGS. 7A-7B, when substrate 130 is a piece of glass with the front side coated with metal as the back contact layer of a solar cell, the metal layer may reflect heat from the at least one inner heater 117 to the glass layer. FIG. 7A is a top view illustrating an example with at least one inner heater 117 and at least one outer heater 118 which are configured to heat a substrate 130 from both its back and front surface. FIG. 7B is a magnified cross-section view of a portion of substrate 130 in FIG. 7A. As shown in FIG. 7B, the front surface of glass substrate is coated with a metal layer 124, which will be the back contact layer of a solar cell. The back surface 122 of substrate 130 is glass. Metal layer 124 reflects the heat from the back surface 122 which will absorb such extra heat. The at least one outer heater 118 can be configured to generate additional heat to maintain uniform temperature distribution across substrate 130. This example is used for illustration purpose only. The at least one outer heater 118 can be used in other ways.

In some embodiments, the at least inner heater 117 or the at least one outer heater 118 is configured to heat substrate 130 according to a predetermined heating profile. For example, a stepwise heating profile with various heating rates can be used in some embodiments. In some embodiments, both the at least one inner heater 117 and the at least one outer heater 118 is configured to operate according to a predetermined heating profile. In some embodiments, the heating profile comprises heating the substrate from room temperature to final high temperature step by step instead of straight heating. Each step of heating can be 100° C. interval and stay at that temperature for 5 minutes. Thus the temperature difference between substrate center and edge can be minimized. In some embodiments, the at least one inner heater 117 is configured to be operated according to a program which provides automatic adjustment according to actual temperature of a sample 130 during a process.

Apparatus 100 also comprises a cooling element 115 in some embodiments. Cooling element 115 is configured to cool down the temperature inside vacuum chamber 105, for example, between two operations, or before a new plurality of substrates 130 is loaded onto rotatable substrate support 120. For example, temperature of inner chamber wall can reach a temperature up to 700° C. after a deposition process. Cooling element 115 is a coil system having a coolant such as water in some embodiments. Apparatus 100 can be also configured to introduce conductive cooling gas such as nitrogen inside vacuum chamber 105, in accordance with some embodiments of this disclosure. The method of cooling using gas inside vacuum chamber 105 and the method using coil cooling with a coolant can be used separately or simultaneously.

In some embodiments, apparatus 100 further comprises one or more additional heaters 119 coupled to the plurality of metal frames 124 or metal posts 121 in rotatable substrate support 120. The additional heaters 119 are configured to rotate with the substrate support 120 and heat a respective substrate 130 during rotation. Examples of an additional heater 119 include, but are not limited to, infrared heaters, halogen bulb heaters, resistive heaters, or any suitable heater for heating a substrate 130 during a deposition process. Additional heaters 119 can be lamp heaters configured to emit infra-red radiation in some embodiments.

Figure 8:
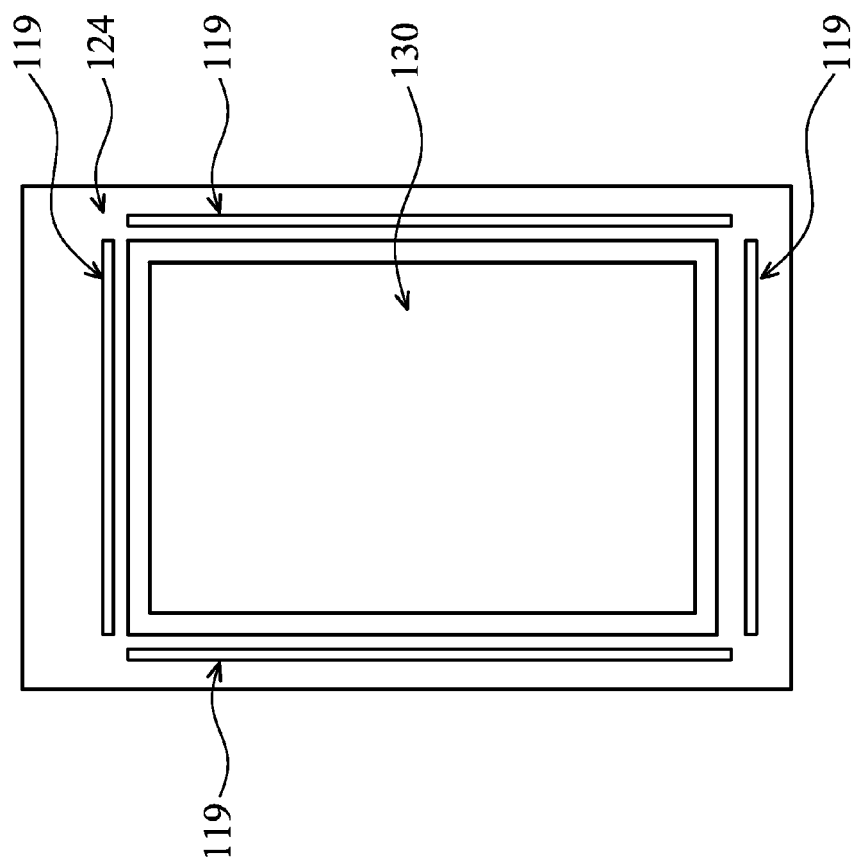
FIG. 8 is a schematic view of a portion of an example of apparatus, showing that one or more additional heaters are coupled to metal frames or metal posts in the rotatable substrate support, in accordance with some embodiments.

FIG. 8 is a schematic view of a portion of an example of rotatable substrate support 120 in apparatus 100. FIG. 8 shows that one or more additional heaters 119 are coupled to metal frames 124 or metal posts 121 in rotatable substrate support 120, in accordance with some embodiments. An additional heater 119 can be provided on each edge of a respective metal frame 124 or a metal post 121. In some embodiments, additional heaters are only on a top or bottom edge of a metal frame 124 or a metal post 121. In some embodiments, additional heaters 119 are only on side edges of a metal frame 124 or a metal post 121. In some embodiments, additional heaters 119 are on both top or bottom edges and side edges of a metal frame 124 or a metal post 121. In some embodiments, different combinations of additional heaters 119 are configured to provide different heating zones. The heat emitted from additional heaters 119 can be used to offset heat absorbed by metal posts 121 or metal frames 124. Additional heaters 119 can also be operated according to a predetermined heating profile or a computer program providing automatic response to actual temperature on substrate 130 inside vacuum chamber 105. Additional heaters 119 can be coordinated with the at least one inner heater 117 and the at least one outer heater 118 during a process.

Referring back to FIG. 1, in some embodiments, apparatus 100 further comprises at least one sputtering source 135, at least one evaporation source 140 and at least one isolation pump 152. Each of the at least one sputtering source 135 is configured to deposit a respective first ingredient. In some embodiments, the respective first ingredient is one ingredient of an absorber layer over a front surface of substrate 130. The at least one evaporation source 140 is disposed in vacuum chamber 105 and configured to deposit a second ingredient. In some embodiments, the second ingredient is one ingredient of the absorber layer over the front surface of substrate 130. Each of the least one isolation pump 152 is configured to prevent materials from the at least one evaporation source 140 from contaminating the at least one sputtering source 135. A respective isolation pump 152 is disposed between each of the at least one sputtering source 135 and an adjacent one of the at least one evaporation source 140 in some embodiments.

The at least one sputtering source 135 can be disposed on the housing defining vacuum chamber 105. Sputtering source 135 can be, for example, a magnetron, an ion beam source, a RF generator, or any suitable sputtering source configured to deposit a respective first ingredient for an absorber layer over the front surface of substrates 130. Each sputtering source 135 includes at least one sputtering target 137. Sputtering source 135 can utilize a sputtering gas. In some embodiments, sputtering is performed with an argon gas. Other possible sputtering gases include krypton, xenon, neon, and similarly inert gases.

As shown in FIG. 1, apparatus 100 can include at least two sputtering sources 135. Each sputtering source 135, having at least one sputtering target 137, is configured to deposit a portion of a respective first ingredient for an absorber layer over a front surface of substrate 130. Each respective first ingredient for the absorber layer can have a different chemical composition. In some embodiments, the at least two sputtering sources 135 are disposed adjacent to each other. In some other embodiments, the at least two sputtering sources 135 are disposed in two locations spaced apart from each other. For example, in FIG. 1, a first and second sputtering source 135 are disposed on opposing sides of vacuum chamber 105 and substantially equidistant from evaporation source 140 about the perimeter of vacuum chamber 105.

In some embodiments, a first sputtering source 135 is configured to deposit atoms of a first type (e.g. copper (Cu)) in the first ingredient for absorber layer over at least a portion of a surface of substrate 130. A second sputtering source 135 is configured to deposit atoms of a second type (e.g. indium (In)) in the first ingredient for absorber layer over at least a portion of a surface of substrate 130. In some embodiments, the first sputtering source 135 is configured to deposit atoms of a first type (e.g. copper (Cu)) and a third type (e.g. gallium (Ga)) in the first ingredient for absorber layer over at least a portion of substrate 130. In some embodiments, a first sputtering source 135 includes one or more copper-gallium sputtering targets 137 and a second sputtering source 135 includes one or more indium sputtering targets 137. For example, a first sputtering source 135 can include two copper-gallium sputtering targets and a second sputtering source 135 can include two indium sputtering targets. In some embodiments, a copper-gallium sputtering target 137 includes a material of approximately 70 to 80% (e.g. 69.5 to 80.5%) copper and approximately 20 to 30% (e.g. 19.5 to 30.5%) gallium. In some embodiments, apparatus 100 has a first copper-gallium sputtering target 137 at a first copper: gallium concentration and a second copper-gallium sputtering target 137 at a second copper: gallium concentration for grade composition sputtering. For example, a first copper-gallium sputtering target can include a material of 65% copper and 35% gallium to control monolayer deposition to a first gradient gallium concentration and a second copper-gallium sputtering target can include a material of 85% copper and 15% gallium to control monolayer deposition to a second gradient gallium concentration. The plurality of sputtering targets 137 can be any suitable size. For example, the plurality of sputtering targets 137 can be approximately 15 cm wide (e.g. 14-16 cm) and approximately 1.9 m tall (e.g. 1-8-2.0 m).

In some embodiments, a sputtering source 135 that is configured to deposit a plurality of absorber layer atoms of indium over at least a portion of each substrate 130 can be doped with sodium (Na). For example, an indium sputtering target 137 of a sputtering source 135 can be doped with sodium (Na) elements. Doping an indium sputtering target 137 with sodium may avoid or minimize an alkali-silicate layer in the solar cell. This improvement may result in lower manufacturing costs for the solar cell as sodium is directly introduced to the absorber layer. In some embodiments, a sputtering source 135 is a sodium-doped copper source having between approximately two and ten percent sodium (e.g. 1.95 to 10.1 percent sodium). In some embodiments, an indium sputtering source 135 can be doped with other alkali elements such as, for example, potassium. In other embodiments, apparatus 100 can include multiple copper-gallium sputtering sources 135 and multiple sodium doped indium sputtering sources 135. For example, apparatus 100 can have a 65:35 copper-gallium sputtering source 135 and an 85:15 copper-gallium sputtering source 135 for grade composition sputtering.

In some embodiments, an evaporation source 140 is configured to deposit a second ingredient of the absorber layer over at least a portion of each substrate 130. In some embodiments, the second ingredient of the absorber layer comprises selenium, and can include any suitable evaporation source material. In some embodiments, evaporation source 140 is configured to produce a vapor of such an evaporation source material. The vapor can condense upon substrate 130. For example, evaporation source 140 can be an evaporation boat, crucible, filament coil, electron beam evaporation source, or any suitable evaporation source 140. In some embodiments, evaporation source 140 is disposed in a first sub-chamber of vacuum chamber 105. In some embodiments, the vapor of source material can be ionized, for example using an ionization discharger, prior to condensation over substrate 130 to increase reactivity.

An isolation pump 152 is configured to prevent materials from the at least one evaporation source 140 from contaminating the at least one sputtering source 135. In some embodiments, a respective isolation pump 152 is disposed between each of the at least one sputtering source 135 and an adjacent one of the at least one evaporation source 140. In the embodiment of FIG. 1, isolation pumps 152 are vacuum pumps. In some embodiments (not shown), one or more of the isolation pumps 152 is configured to maintain the pressure in an evaporator source 140 sub-chamber (not shown) lower than the pressure in vacuum chamber 105. Isolation pumps 152 can be configured to evacuate absorber layer particles of the second ingredient (emitted by evaporation source 240) from vacuum chamber 105, prevent diffusion of these particles into the sputtering targets 237, and prevent these particles from contaminating the two sputtering sources 235.

In embodiments including a plurality of sputtering sources 135 and/or a plurality of evaporation sources 140, apparatus 100 can include a plurality of isolation sources to isolate each of the evaporation sources from each of the sputtering sources 135. For example, in embodiments having first and second sputtering sources 135 disposed on opposing sides of a vacuum chamber and an evaporation source 140 disposed there between on a perimeter of the vacuum chamber 105, apparatus 100 can include a first isolation pump 152 disposed between the first sputtering source 135 and evaporation source 140 and a second isolation pump 152 disposed between the second sputtering source 135 and evaporation source 140. In the illustrated embodiment, apparatus 100 includes an isolation pump 152 disposed between evaporation source 140 and one of the two sputtering sources 135.

As shown in FIG. 1, apparatus 100 can include an isolation baffle 170 disposed about the evaporation source 140. Isolation baffle 170 can be configured to direct a vapor of an evaporation source material to a particular portion of substrate 130. Isolation baffle 170 can be configured to direct a vapor of an evaporation source material away from a sputtering source 135. Apparatus 100 can include an isolation baffle 170 in addition to one or more isolation sources to minimize evaporation source material 122 contamination of one or more sputtering sources 135. Isolation baffle 170 can be composed of a material such as, for example, stainless steel or other similar metals and metal alloys. In some embodiments, isolation baffle 170 is disposable. In other embodiments, isolation baffle 170 is cleanable.

In some embodiments, apparatus 100 can include a loading/unloading substrate chamber 182, buffer chamber 155, post-treatment chamber 180 and unload lock 184. In various embodiments, post-treatment chamber 180 can be configured for post treatment of the solar cell such as, for example, cooling the solar cell.

In some embodiments, apparatus 100 can include one or more in-situ monitoring devices (not shown) to monitor process parameters such as temperature, chamber pressure, film thickness, or any suitable process parameter.

Apparatus 100 of FIG. 1 can also be used to form solar cells of different absorber films, for example, a copper-zinc-tin-sulfur-selenium (CZTSS) absorber film. In some embodiments, a number of CZTSS absorber layer are formed in apparatus 100 by further providing tin, copper, zinc, or copper/zinc targets, as targets 137. Evaporation source 140 may use sulfur, selenium or both sulfur and selenium as source material. Additionally, another evaporation source 140 may be used to separately provide selenium and sulfur source material.

Figure 2:
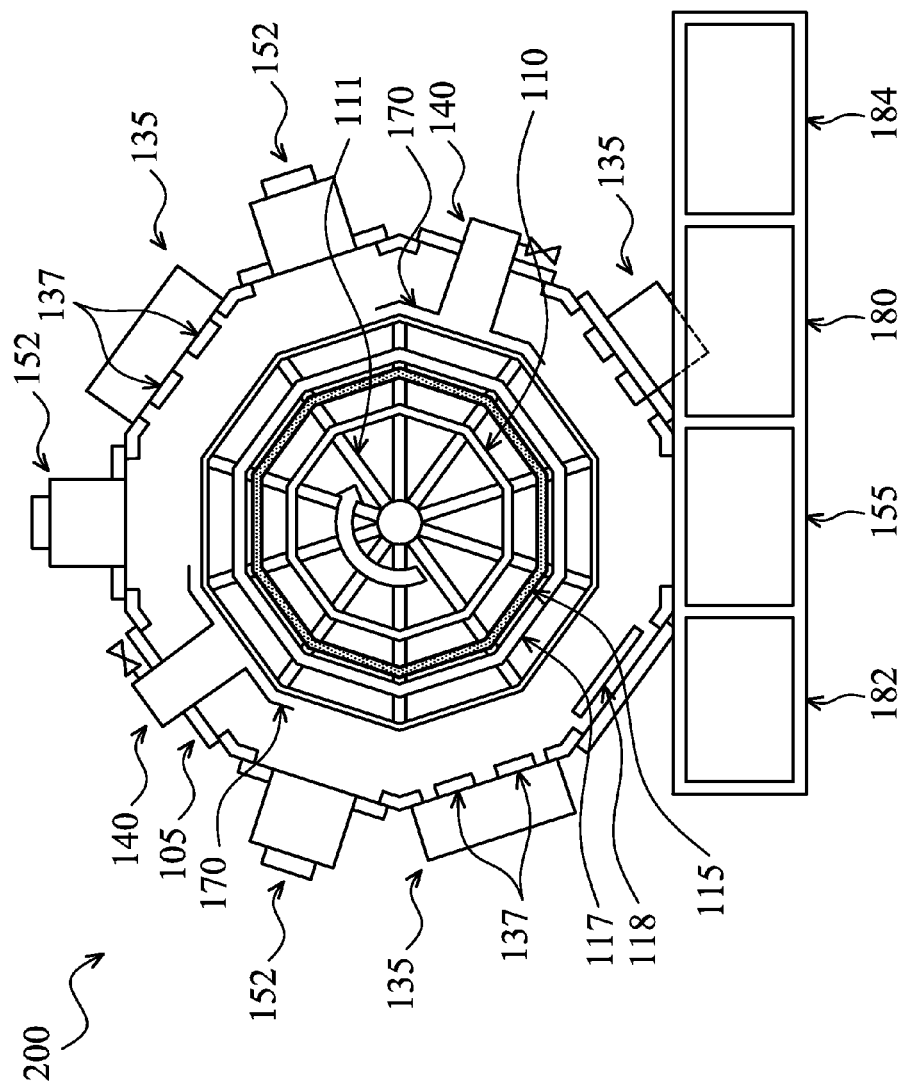
FIG. 2 is a plan view of an apparatus for forming a solar cell, which comprises at least three sputtering sources, at least one evaporation source, at least one inner heater and at least one outer heater, in accordance with some embodiments.

FIG. 2 is a plan view of an apparatus 200 for forming a solar cell in accordance with some embodiments. Apparatus 200 comprises at least two (e.g., three) sputtering sources 135, at least one evaporation source 140, at least one inner heater and at least one outer heater. In FIG. 2, like items are indicated by like reference numerals, and for brevity, descriptions of the structure, provided above with reference to FIG. 1, are not repeated. The at least two (e.g., three) sputtering sources 135 are configured to deposit at least three different compositions as a respective first ingredient for an absorber layer over a front surface of substrate 130. For example, a first sputtering source 135 is configured to deposit copper and gallium from a first target 137 comprising copper and/or gallium. A second sputtering source 135 is configured to deposit indium from a first target 137 comprising indium. In some embodiments, copper and gallium can be deposited in two different first sputtering sources 135.

Figure 9:
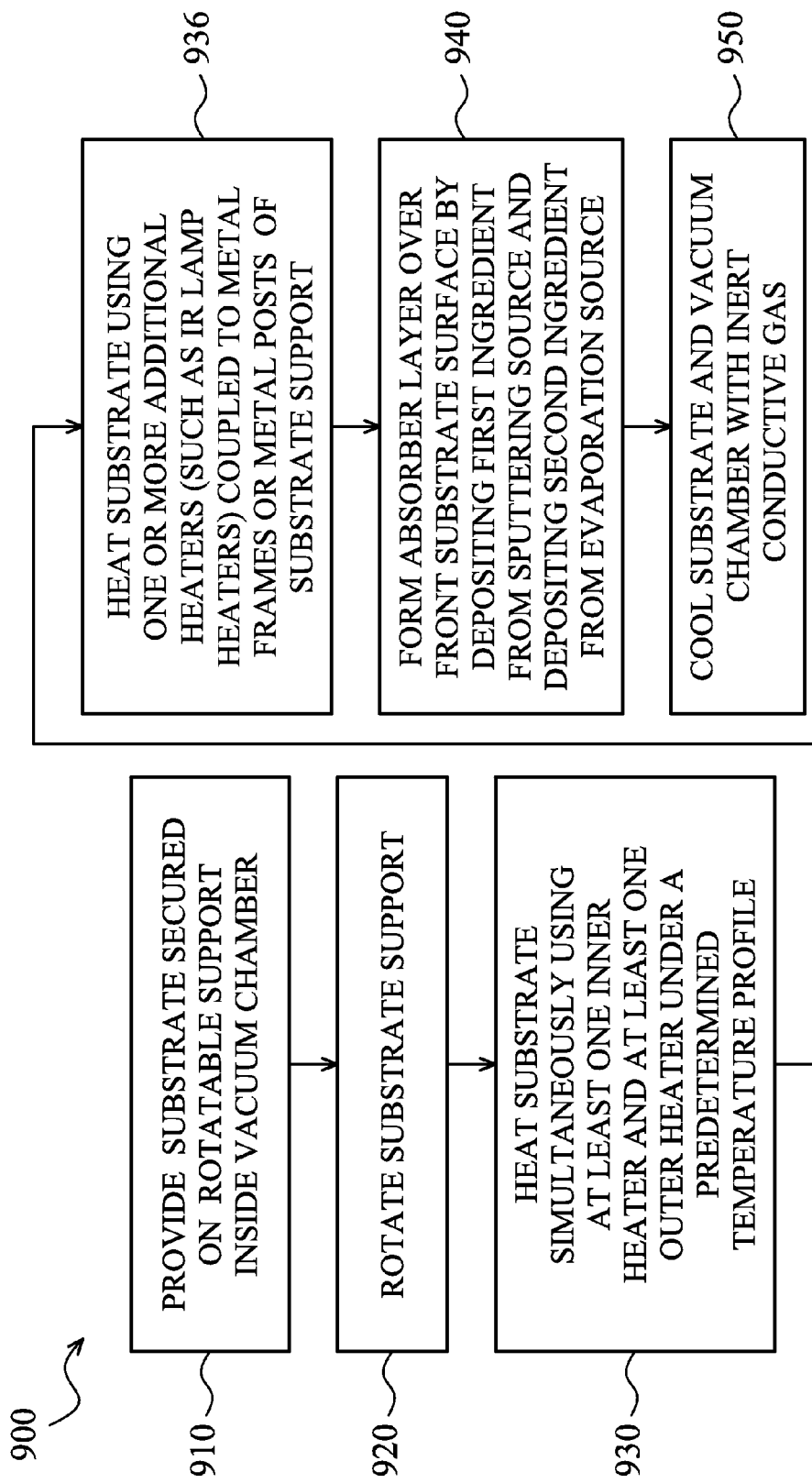
FIG. 9 is a flow chart diagram illustrating an example of method for fabricating solar cells comprising heating a substrate simultaneously from both its front surface and its back surface, in accordance with some embodiments.

FIG. 9 is a flow chart diagram illustrating an example of method 900 for fabricating solar cells comprising heating a substrate simultaneously from both its front surface and its back surface, in accordance with some embodiments.

In step 910 of this exemplary method 900, a substrate 130 is first provided and secured on a rotatable substrate support 120 inside a vacuum chamber 105 in an apparatus for forming solar cells. For example, the apparatus 100 or 200 described above can be used. Substrate 130 has a front surface and a back surface. Examples of substrate 130 and configurations for holding substrate 130 are described in FIG. 1. Rotatable substrate support 120 is in a polygon shape and comprises a plurality of metal posts 121 and metal frames 124 in some embodiments. Metal posts 121 and metal frames are configured to hold substrate 130, as described in FIGS. 3A-3B, 4A-4B, 5A-5C and 6A-6C. The front surface of substrate 130 is disposed facing an interior surface of vacuum chamber 105 in some embodiments, as shown in FIGS. 7A-7B.

In step 920, substrate support 120 is rotated. In some embodiments, substrate support 120 is continuously rotated at a certain speed as described in FIG. 1. In some embodiments, substrate support 120 is intermittently rotated.

Step 930 comprises heating substrate 130 simultaneously using at least one inner heater 117 and at least one outer heater 118 as described in FIG. 1. The inner heaters 117 faces a back surface of the substrate 130 and heats substrate 130 from the back surface of substrate 130. The at least one outer heater is configured to heat a front surface of the substrate during rotation in some embodiments. In some embodiments, substrate 130 is simultaneously heated using the at least one inner heater 117 and the at least one outer heater 118, according to a predetermined temperature profile. In some embodiments, the at least one inner heater 117 or at least one outer heater 118, or both, heat substrate according to a predetermined temperature profile as described in FIG. 1. In Some embodiments, the predetermined temperature profile is used for minimizing temperature difference between the substrates and a plurality of metal posts or metal frames in the rotatable substrate support. In some embodiments, the at least one inner heater 117 or at least one outer heater 118 or both are operated based on a program providing automatic response based on the actual temperature of substrate 130 inside vacuum chamber 105.

Step 936 is used in some embodiments, and is omitted from other embodiments. In some embodiments, the method 900 further comprises heating substrate 130 using one or more additional heaters 119 coupled to the plurality of metal frames 124 or metal posts 121 in rotatable substrate support 120. As described in FIG. 1, examples of additional heaters 119 include, but are not limited to, lamp heaters emitting infrared radiation, for example, IR lamps. The one or more additional heaters 119 rotate with substrate support 120 in some embodiments.

In step 940, an absorber layer is formed over the front surface of substrate 130 as described above. In some embodiments, the step of forming an absorber layer over the front surface of substrate 130 (in step 940) includes depositing a respective first ingredient for an absorber layer over the front surface of substrate 130 from at least one sputtering source 135; and depositing a second ingredient of the absorber layer over the front surface of substrate 130 from an evaporation source 140 disposed in the vacuum chamber 105. In depositing the second ingredient, at least one isolation pump 152 as described in FIG. 1, is used to prevent materials from the at least one evaporation source 140 from contaminating the at least one sputtering source 135.

Figure 10:
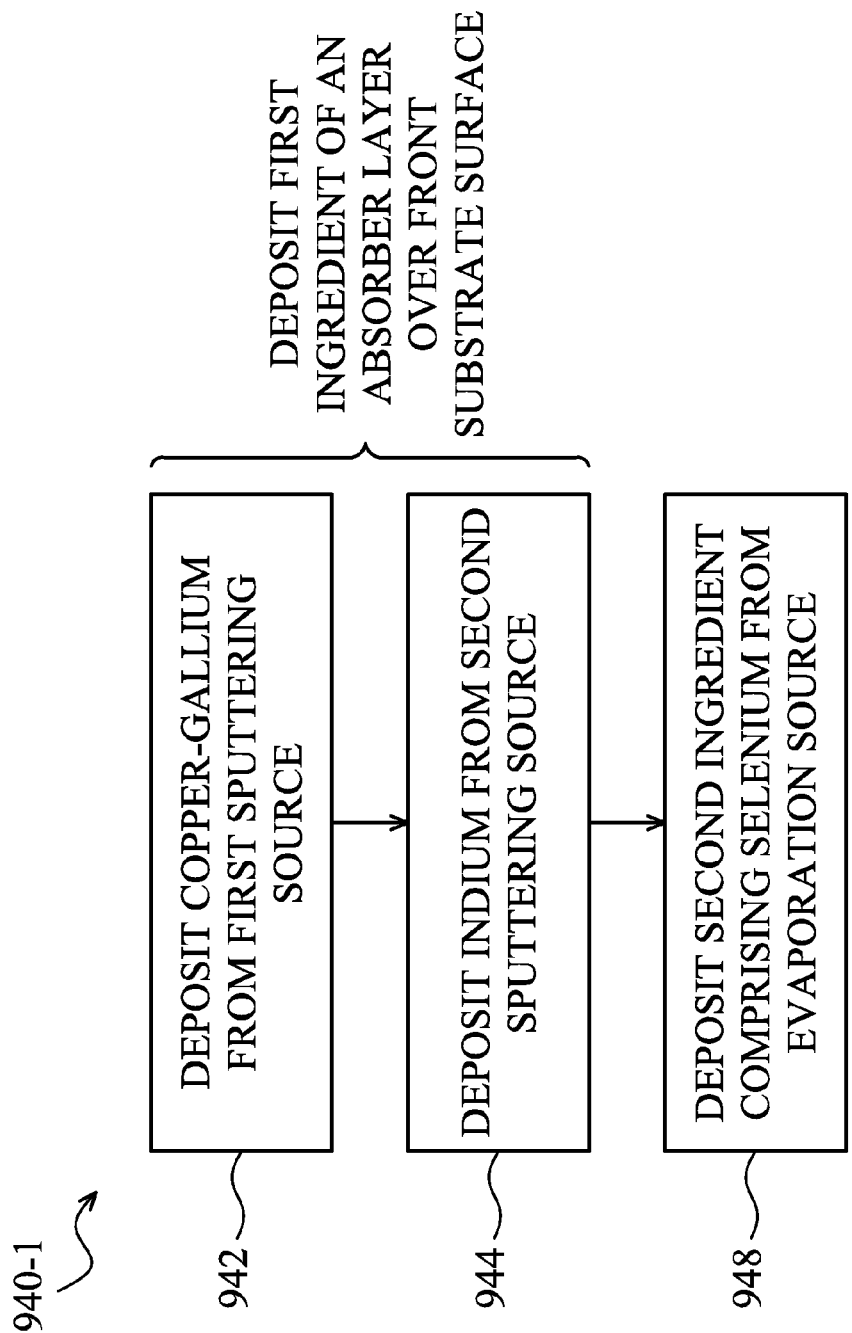
FIG. 10 is a flow chart diagram illustrating an example of method for forming absorber layer over the front surface of a substrate in some embodiments.

FIG. 10 is a flow chart diagram illustrating an example of a method for forming an absorber layer over the front surface of a substrate. In some embodiments, substrate 130 comprises a glass layer in the back surface and a metal layer deposited over the glass layer on the front surface. The step of depositing a respective first ingredient for an absorber layer (in step 940 of FIG. 9) comprises at least three steps in the example of FIG. 10. These include: depositing copper and gallium from a first sputtering source 135 (step 942); and depositing indium from a second sputtering source 135 (step 944). The step of depositing the second ingredient of the absorber layer comprises depositing selenium from an evaporation source 140 in step 948.

Referring back to FIG. 9, in some embodiments, the method also comprises step 950 of cooling substrate 130 and vacuum chamber 105 with an inert conductive gas after forming an absorber layer, or any other layers of solar cells.

This disclosure provides an apparatus and a method for forming a solar cell. In accordance with some embodiments, the apparatus for forming a solar cell comprises a housing defining a vacuum chamber; a rotatable substrate support, at least one inner heater and at least one outer heater. The rotatable substrate support inside the vacuum chamber is configured to hold a substrate. The at least one inner heater is between a center of the vacuum chamber and the substrate support, and is configured to heat back surface of a substrate on the substrate support. The at least one outer heater is located between the housing and the substrate support, and is configured to heat a front surface of a substrate on the substrate support. In some embodiments, the at least one outer heater is attached on the interior surface of the vacuum chamber. In some embodiments, the apparatus also comprises a rotatable drum configured to rotate the substrate support inside the vacuum chamber. In some embodiments, the apparatus of this disclosure further comprises at least one sputtering source, at least one evaporation source and at least one isolation pump. In some embodiments, the apparatus further comprises one or more additional heaters coupled to the plurality of metal frames or metal posts in the rotatable substrate support. The additional heaters are configured to rotate with the substrate support and heat a respective substrate during rotation.

In accordance with some embodiments, this disclosure provides an apparatus for forming a solar cell, comprising a vacuum chamber, a rotatable substrate support, a rotatable drum, at least one sputtering source, at least one evaporation source, at least one inner heater and at least one outer heater. The rotatable substrate support inside the vacuum chamber is of a polygonal shape configured to hold at least one substrate. The rotatable drum is disposed within the vacuum chamber. The at least one sputtering source is configured to deposit a respective first ingredient, for example, a respective first ingredient for an absorber layer over a front surface of the substrate. The at least one evaporation source is disposed in the vacuum chamber and configured to deposit a second ingredient, for example, a second ingredient for the absorber layer over the front surface of the substrate. Each inner heater faces a back surface of a respective substrate, and is configured to heat that substrate. The at least one outer heater is disposed between an outer surface (shell) of the vacuum chamber and the rotatable substrate support, is configured to heat a front surface of the at least one substrate during rotation. In some embodiments, the apparatus further comprises one or more additional heaters coupled to a plurality of metal frames or metal posts in the rotatable substrate support. The one or more additional heaters are configured to rotate with the substrate support and heat a respective substrate during rotation. In some embodiments, the apparatus also comprises at least one isolation pump. The at least one isolation pump is disposed between each of the at least one sputtering source and an adjacent one of the at least one evaporation source, and is configured to prevent materials from the evaporation source from contaminating the sputtering source.

This disclosure also provides a method for forming a solar cell. A substrate is first provided and secured on a rotatable substrate support inside a vacuum chamber. The front surface of a substrate is disposed facing an interior surface of the vacuum chamber. The method further comprises rotating the substrate support; heating the substrate simultaneously using at least one inner heater and at least one outer heater; and forming an absorber layer over the front surface of the substrate. The inner heater faces a back surface of the substrate and heats the substrate from the back surface of the substrate. The at least one outer heater is configured to heat a front surface of the substrate during rotation. The forming an absorber layer over the front surface of the substrate includes depositing a respective first ingredient for an absorber layer over the front surface of the substrate from at least one sputtering source; and depositing a second ingredient of the absorber layer over the front surface of the substrate from an evaporation source disposed in the vacuum chamber. In some embodiments, the substrate comprises a glass layer coated with a metal layer on the front surface. The depositing a respective first ingredient for an absorber layer comprises depositing copper, gallium and indium from at least two different sputtering sources, respectively. The depositing the second ingredient of the absorber layer comprises depositing selenium from the evaporation source.

In some embodiments, the method further comprises heating the substrate using one or more additional heaters coupled to the plurality of metal frames or metal posts in the rotatable substrate support. The one or more additional heaters rotate with the substrate support. In some embodiments, the method also comprises cooling the substrate and the vacuum chamber with an inert conductive gas after forming an absorber layer.

Although the subject matter has been described in terms of exemplary embodiments, it is not limited thereto. Rather, the appended claims should be construed broadly, to include other variants and embodiments, which may be made by those skilled in the art.

What is claimed is:

1. A method for forming a solar cell, comprising:
   securing a substrate on a rotatable substrate support inside a vacuum chamber, wherein the substrate has a front surface and a back surface, the front surface is disposed facing an interior surface of the vacuum chamber, and the rotatable substrate support defines at least one opening;
   rotating the substrate support;
   heating the substrate simultaneously using at least one inner heater and at least one outer heater, the inner heater facing a back surface of the substrate, and the at least one outer heater heating a front surface of the substrate during rotation, and
   heating the substrate using one or more additional heaters in the rotatable substrate support, wherein the one or more additional heaters rotate with the substrate support.

2. The method of claim 1, wherein
   the heating the substrate simultaneously using the at least one inner heater and the at least one outer heater is performed according to a predetermined temperature profile for minimizing temperature difference between the substrate and a plurality of posts or a frame in the rotatable substrate support.

3. The method of claim 1, wherein the one or more additional heaters are lamp heaters configured to emit infrared radiation, resistive heaters, or combinations thereof.

4. The method of claim 1, further comprising:
   forming an absorber layer over the front surface of the substrate, including:
      depositing a respective first ingredient for an absorber layer over the front surface of the substrate from at least one sputtering source; and
      depositing a second ingredient of the absorber layer over the front surface of the substrate from at least one evaporation source disposed in the vacuum chamber.

5. The method of claim 4, wherein at least one isolation pump is disposed between each of the at least one sputtering source and an adjacent one of the at least one evaporation source, and is used to prevent materials from the at least one evaporation source from contaminating the at least one sputtering source.

6. The method of claim 4, wherein
   the substrate comprises a glass layer in the back surface and a metal layer deposited over the glass layer on the front surface;
   the depositing a respective first ingredient for an absorber layer comprises:
      depositing copper and gallium from a first sputtering source; and
      depositing indium from a second sputtering source; and
   the depositing the second ingredient of the absorber layer comprises depositing selenium from the evaporation source.

7. The method of claim 4, further comprising:
   cooling the substrate and the vacuum chamber with an inert conductive gas after forming an absorber layer.

8. The method of claim 1, wherein the substrate is secured on the rotatable substrate support by holding the entire length of the respective substrate through the at least one opening of the rotatable substrate support.

9. The method of claim 1, wherein the substrate is attached with a respective frame contacting along a portion of the length of the respective substrate, and each substrate edge is retained by a respective fixture at selected points on the respective frame.

10. A method for forming a solar cell, comprising:
    securing a substrate on a rotatable substrate support inside a vacuum chamber, wherein the substrate has a front surface and a back surface, the front surface is disposed facing an interior surface of the vacuum chamber;
    rotating the substrate support;
    heating the substrate using at least one inner heater and at least one outer heater, the inner heater facing a back surface of the substrate, and the at least one outer heater configured to heat a front surface of the substrate during rotation; and
    heating the substrate using one or more additional heaters coupled to the rotatable substrate support, wherein the one or more additional heaters rotate with the substrate support.

11. The method of claim 10, wherein the substrate comprises a glass layer in the back surface and a metal layer deposited over the glass layer on the front surface.

12. The method of claim 10, wherein
    the steps of heating the substrate using the at least one inner heater, the at least one outer heater and the one or more additional heaters are performed according to a predetermined temperature profile for minimizing temperature difference between the substrates and the rotatable substrate support.

13. The method of claim 10, further comprising:
    forming an absorber layer over the front surface of the substrate.

14. The method of claim 10, wherein the one or more additional heaters are lamp heaters configured to emit infrared radiation.

15. A method for forming a solar cell, comprising:
    securing a substrate on a rotatable substrate support inside a vacuum chamber, wherein the substrate has a front surface and a back surface, the front surface is disposed facing an interior surface of the vacuum chamber;
    rotating the substrate support;
    heating the substrate simultaneously using at least one inner heater and at least one outer heater according to a predetermined temperature profile, the inner heater facing a back surface of the substrate, and the at least one outer heater heating a front surface of the substrate during rotation;

simultaneously heating the substrate using one or more additional heaters coupled to a plurality of metal frames or metal posts in the rotatable substrate support, wherein the one or more additional heaters rotate with the substrate support; and forming an absorber layer over the front surface of the substrate.

16. The method of claim 15, wherein the step of forming the absorber layer comprises depositing a respective first ingredient for an absorber layer over the front surface of the substrate from at least one sputtering source; and depositing a second ingredient of the absorber layer over the front surface of the substrate from an evaporation source disposed in the vacuum chamber.

17. The method of claim 15, wherein the depositing a respective first ingredient for an absorber layer comprises:

depositing copper and gallium from a first sputtering source; and depositing indium from a second sputtering source;

and the depositing the second ingredient of the absorber layer comprises depositing selenium from the evaporation source.

18. The method of claim 15, further comprising:

cooling the substrate and the vacuum chamber with an inert gas after forming an absorber layer.

* * * * *